(12) United States Patent
Ghandehari et al.

(10) Patent No.: US 6,994,939 B1
(45) Date of Patent: Feb. 7, 2006

(54) SEMICONDUCTOR MANUFACTURING RESOLUTION ENHANCEMENT SYSTEM AND METHOD FOR SIMULTANEOUSLY PATTERNING DIFFERENT FEATURE TYPES

(75) Inventors: Kouros Ghandehari, Santa Clara, CA (US); Jean Y. Yang, Sunnyvale, CA (US); Christopher A. Spence, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 171 days.

(21) Appl. No.: 10/283,685

(22) Filed: Oct. 29, 2002

(51) Int. Cl.
*G03F 9/00* (2006.01)

(52) U.S. Cl. .................. 430/5; 430/311; 430/312; 430/320; 430/321; 430/322; 430/323; 430/324

(58) Field of Classification Search ............ 430/5, 430/311, 312, 32, 321, 322, 323, 324, 320
See application file for complete search history.

(56) References Cited

U.S. PATENT DOCUMENTS

| | | | |
|---|---|---|---|
| 5,439,764 A * | 8/1995 | Alter et al. ................. 430/5 |
| 5,897,979 A * | 4/1999 | Tzu et al. ................... 430/5 |
| 5,906,910 A * | 5/1999 | Nguyen et al. ........... 430/311 |
| 5,935,736 A * | 8/1999 | Tzu ............................ 430/5 |
| 5,939,227 A * | 8/1999 | Smith ........................ 430/5 |
| 6,120,942 A * | 9/2000 | Reinberg ................... 430/5 |
| 6,327,033 B1 | 12/2001 | Ferguson et al. ......... 356/394 |
| 6,436,587 B1 * | 8/2002 | Ulrich et al. ............... 430/5 |
| 6,599,666 B2 * | 7/2003 | Rolfson ...................... 430/5 |
| 6,632,576 B2 * | 10/2003 | Tejnil ......................... 430/5 |
| 2002/0015899 A1 * | 2/2002 | Chen et al. ................. 430/5 |
| 2002/0187431 A1 * | 12/2002 | Tanaka .................... 430/321 |
| 2003/0091911 A1 * | 5/2003 | Noelscher .................. 430/5 |

* cited by examiner

*Primary Examiner*—Barbara L. Gilliam
(74) *Attorney, Agent, or Firm*—Mikio Ishimaru

(57) ABSTRACT

A method and system of making a mask with a transparent substrate thereon is provided. A first resolution enhancement structure is formed on the first portion of the transparent substrate. A second resolution enhancement structure is formed on a second portion of the transparent substrate, with the second resolution enhancement structure different from the first resolution enhancement structure.

28 Claims, 2 Drawing Sheets

SEMICONDUCTOR MANUFACTURING RESOLUTION ENHANCEMENT SYSTEM AND METHOD FOR SIMULTANEOUSLY PATTERNING DIFFERENT FEATURE TYPES

BACKGROUND

1. Technical Field

The present invention relates generally to photolithography and more particularly to patterning different types of features.

2. Background Art

Integrated circuits are now used in almost every type of electronic product ranging from toys to massive computers. These integrated circuits are all generally made by a photolithographic process, which involves manufacturing a template containing patterns of the electrical circuit as transparent and opaque areas. The patterned template is referred to as a "reticle" or "mask".

A radiation source, such as a light, is used to copy or "pattern" multiple images of the mask onto a photosensitive material or photoresist on the surface of a silicon wafer. Once features are patterned on the photoresist, further processing is performed to form various structures on the silicon wafer, which is subsequently cut up to form the integrated circuits. In addition to repeatedly "patterning" features onto the photoresist on the silicon wafer with a single mask, multiple masks are used to pattern different photoresist layers to form different structures at different levels on the silicon wafer.

In conventional industry practice, the masks are fabricated starting from an initial mask blank, which is transparent to the imaging light. Typically, the mask blank consists of fused silica or quartz. The mask blank is coated by an opaque film, typically a chromium based material. The opaque film is also processed using another mask and a photoresist to create openings in the opaque film to expose and permit light to pass through the openings and through the transparent quartz.

As the size and density of features start to be below the wavelength of the light used to pattern the images, a different class of masks is necessary because the light is subject to diffraction and interference effects. Diffraction effects are due to the wave nature of light, which cause peaks and valleys to occur in the intensity of light passing through an opening, such as an opening in the opaque film, and falling on the photoresist of the silicon wafer. Interference effects occur with side-by-side openings where the peaks and valleys of the light wave can interfere so as to cancel each other out or can reinforce and amplify each other depending on the location of the openings.

This is a problem when the openings are used to pattern features having sizes below the wavelength of the light used and near the resolution limit of the light. Optical distortion becomes extremely high and the correspondence between an image on the mask and the feature on the photoresist is no longer one-to-one because of information loss. This is particularly problematic where different types of features are in the same integrated circuit, such as closely spaced repeating features and spaced-apart non-repeating features.

Solutions to this problem has been long sought but has equally long eluded those skilled in the art.

DISCLOSURE OF THE INVENTION

The present invention provides for a method of making a mask with a transparent substrate. A first resolution enhancement structure is formed on a first portion of the transparent substrate. A second resolution enhancement structure is formed on a second portion of the transparent substrate, with the second resolution enhancement structure different from the first resolution enhancement structure. This method of making a mask allows the patterning of different types of features in the same processing step thus reducing manufacturing time and cost.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
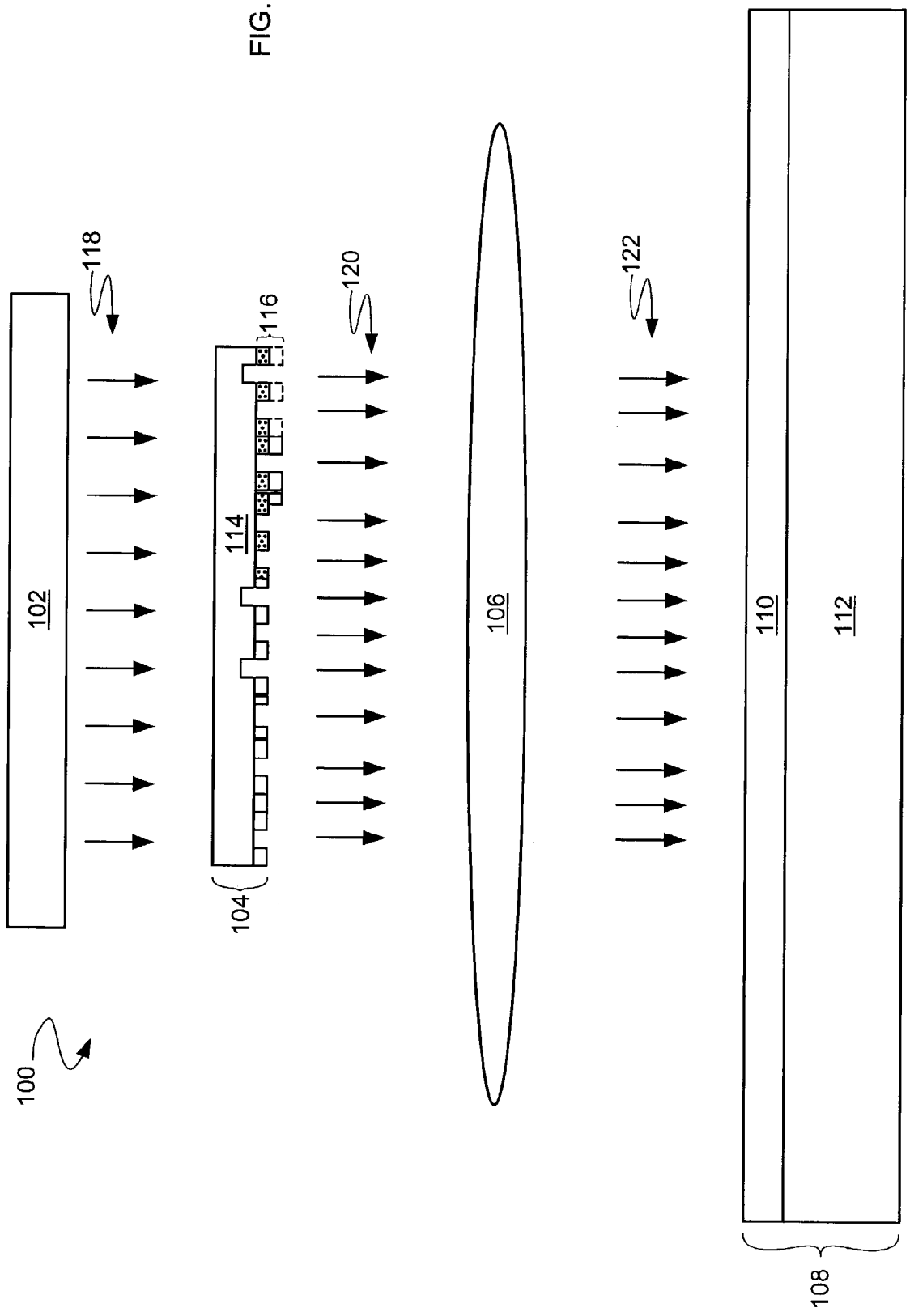
FIG. 1 is a simplified schematic of a photolithographic system using the present invention.

Referring now to FIG. 1, therein is shown a simplified schematic of a photolithographic system 100 using the present invention. In the photolithographic system 100, radiation is directed from an illumination source 102 through a patterned mask 104 and a lens 106 onto a semiconductor wafer 108.

The semiconductor wafer 108 includes a photoresist layer 110 on a semiconductor substrate 112, which will form a plurality of integrated circuits when completed.

The patterned mask 104 includes a light-transparent substrate 114, of a material such as fused silica or quartz, with a patterned mask coating 116.

The term "horizontal" as used in this application is defined as a plane parallel to the conventional plane or surface of the light-transparent substrate 114, where the patterned mask coating 116 is deposited, regardless of the orientation of the substrate. The term "vertical" refers to a direction perpendicular to the horizontal as just defined. Prepositions, such as "on", "side", "higher", "lower", "over", and "under" are defined with respect to the conventional plane or surface being on the top surface of the light-transparent substrate 114, which is shown in an upside down position in the figures.

The term "process" as used herein is defined without being limiting to include one or more of the following: depositing or growing semiconductor materials, masking, patterning, lithography, etching, implanting, removal, and/or stripping.

The present system is applicable to any wavelength of radiation and the modifications for other wavelengths would be obvious to those skilled in the art based on the description of the present invention provided herein.

The illumination source 102 produces light 118, which the patterned mask 104 selectively allows through as patterned light 120 to be focused by the lens 106 on to selected areas of the photoresist layer 110 to reproduce the mask pattern in the patterned mask coating 116.

In photolithographic systems, there is a minimum distance beyond which even a geometrically perfect lens cannot separate two points; i.e., when the two points are less than a minimum distance from each other, the two points cannot be separated or "resolved". This is due to diffraction and interference effects. Diffraction effects are due to the wave nature of light, which cause peaks and valleys to occur in the intensity of light passing through an opening, such as an opening in the opaque film, and falling on the photoresist of the silicon wafer. Interference effects occur with side-by-side openings where the peaks and valleys of the light wave can interfere so as to cancel each other out or can reinforce and amplify each other depending on the location of the openings.

Depending upon how close two points are, the diffraction effect spreads the light from these two points across the imaging lens. If the two points are sufficiently close, the light will be diffracted out of the path of the lens. In this case, the points will be too close to each other and they will be under the limit of resolution of the system. The resolution of a non-perfect lens depends upon the wavelength of the light source and the numerical aperture (NA) of the lens. Two images are considered as being resolvable when the intensity between them drops to 80 percent of the image intensity. Thus, two images are considered resolvable when the equation is fulfilled:

$2D = 0.6 \, \check{S}/NA$ where: 2D is the separation of the two images;

$\check{S}$ is the wavelength of the illumination source 102; and

NA is the numerical aperture of the lens 106.

Figure 2:
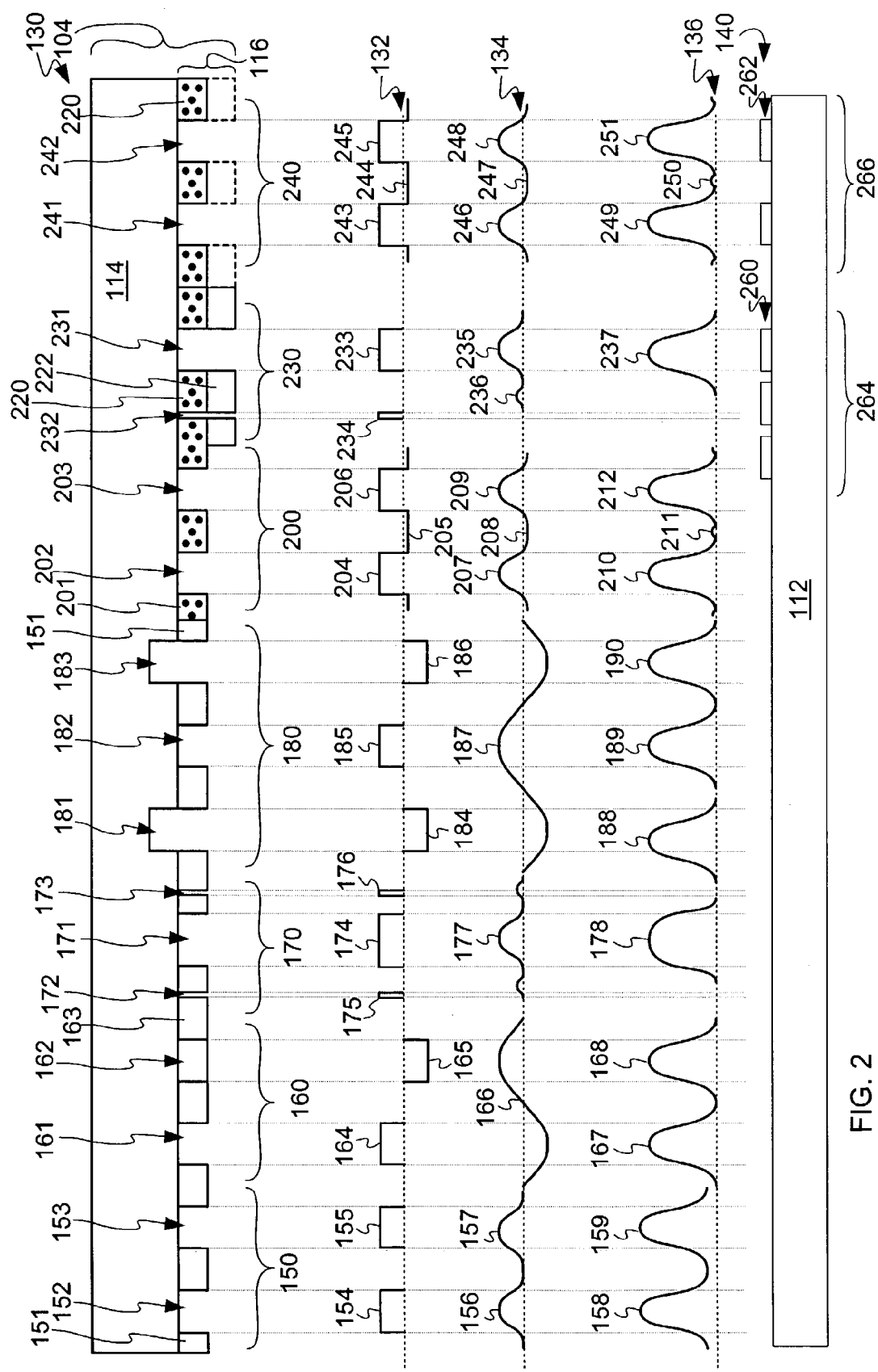
FIG. 2 is a schematic of a mask with representations of the electric field of the light on the mask, the electric field on the photoresist, the intensity of the light on the photoresist, and an integrated circuit in accordance with the present invention.

Referring now to FIG. 2, therein is shown a schematic 130 of the patterned mask 104 with representations of mask electric fields 132 of the light 120 (FIG. 1) from the patterned mask 104, wafer electric fields 134 of the light 122 (FIG. 1) on the photoresist layer 110 due to diffraction effects, and wafer intensities 136 of the light 122 (FIG. 1) on the photoresist layer 110 (the intensities are the square of the wafer electric fields).

There is a major problem in patterning two or more distinctly different types of features at the same time in integrated circuits. For example, integrated circuit memory devices have core polysilicon wordlines and periphery polysilicon gates, which heretofore required different pattern masks because the two different types of features can be different sizes, and/or density features. As the feature size of the structures becomes smaller and smaller, they are harder and harder to image.

In another example, the polysilicon gates of the core transistors and the periphery transistors should be printed at the same time to minimize costs. Unfortunately, the core transistors are a regular array that where the transistors are very close packed together and the periphery transistors are random transistors that are substantially far apart.

On occasion, attempts to pattern the different types of features have used different enhancement resolution techniques in different processing steps. Unfortunately, these attempts have not been completely successful because of interface problems, stringer problems, and gouging.

The inventors have discovered that using different resolution enhancement techniques on different portions of the light-transparent substrate 114 can provide solve this major problem. In one approach, two different types of films are placed on the light-transparent substrate 114 and, in a second approach, one type of film is placed over a different type of film that is on the light-transparent substrate 114. The different resolution enhancement techniques use different resolution enhancement structures. The following are some of the different enhancement structures, which may be used singularly or in combination as different portions of the pattern mask 104 (FIG. 1) in accordance with the present invention.

A binary mask portion 150 is generally for repeating parallel features. An opaque film 151 has repeated parallel openings 152 and 153. The mask electric fields 132 are two spaced apart rectangular blocks 154 and 155. The wafer electric fields 134 are two peaked curves 156 and 157. The mask intensities are two peaked curves 158 and 159. Well-defined peaked curves will produce resolution-enhanced features.

A phase shift mask (PSM) portion 160 is also generally for repeating parallel features. The opaque film 151 has repeated parallel openings 161 and 162. Since phase shifting of light occurs as it passes through different thicknesses of material, an extra layer of transmissive material 163 can be added to one optical path to cause a phase shift. This extra layer of transmissive material 163, such as silicon or quartz, is placed in the opening 162 to produce a phase shift of 180°, and this corresponds to an optical path length difference of $\check{S}/2$. The mask electric fields 132 are two spaced apart rectangular blocks 164 and 165 with the rectangular block 165 having a phase shift of 180° from the rectangular block 164. The wafer electric fields 134 are a sinusoidal curve 166. The mask intensities are two well-defined peaked curves 167 and 168.

A proximity effect mask portion 170 is for single features. The exact size and shape of the features patterned on a semiconductor wafer depend on their closeness, or "proximity", to other structures. The proximity effects appear in the form of distorted shapes and, in extreme cases, no shapes at all. By using computer simulation, a pattern feature opening 171 in the opaque film 151 can be changed by adding or subtracting sub-structures called "optical-proximity-correction-features" (OPC features), such as scattering bar openings 172 and 173. The scattering bar openings 172 and 173 are sub-resolution with lines placed adjacent to isolated lines on the same pitch as dense features. The mask electric fields 132 are a rectangular block 174 with two thin rectangular blocks 175 and 176 to either side, which are at the limits of resolution. The wafer electric fields 134 are a peaked curve 177 with two smaller curves on either side of two higher order diffractions. The mask intensity is a well-defined broad peaked curve 178 with steep sides.

Other examples of OPC features are serifs, which are additional open areas on corners to reduce corner rounding and feature length shortening, line-jogs, which are width variations to adjust for adjacent features.

An alternating phase shift mask (Alt-PSM) portion 180 generally gives the greatest improvement in resolution when closely spaced clear lines are separated on an opaque background. The opaque film 151 has repeated parallel openings 181, 182 and 183. Since phase shifting of light occurs as it passes through different thicknesses of material, the light-transparent substrate 114 can be etched out to cause a phase shift or by depositing transparent material over the entire mask and then etching away the desired areas. The opaque film 151 alternates between openings which are not phase-shifted and openings which are phase-shifted. For example, for the Alt-PSM portion 180, the alternative parallel openings 181 and 183 are etched out to produce a phase shift of 180°, and this corresponds to an optical path length difference of $\check{S}/2$. The mask electric fields 132 are three spaced apart rectangular blocks 184 through 186 with the rectangular blocks 184 and 186 having a phase shift of 180° from the rectangular block 185. The wafer electric fields 134 are a sinusoidal curve 187. The mask intensities are three well-defined peaked curves 188 through 190.

An attenuated phase shift mask (Att-PSM) portion 200 generally gives the greatest improvement in resolution for alternating rows of rectangular transparent areas offset from one another or non-repetitive patterns. The Att-PSM portion 200 is fabricated by replacing the opaque film 151 with a partially transparent film 201, such as a molybdenum silicon-oxynitride film, or patterned to be a half-tone film, such as a half-tone dotted chrome film, to allow only 5% to 10% of the light to pass through the partially transparent film 201. The thickness of the partially transparent film 201 also produces a phase shift of 180°.

The 5% to 10% of the light will be too weak to expose the photoresist to the degree necessary for it to be washed away during development, but the negative amplitude of the phase-shifted light will be sufficient to destructively interfere with the non-phase-shifted light. The partially transparent film 201 has two openings 202 and 203. The mask electric fields 132 are two spaced apart rectangular blocks 204 and 206 connected by a phase shifted small rectangular block 205. The wafer electric fields 134 are two peaked curves 207 and 209 connected by a flattened region 208. The mask intensities are two well-defined peaked curves 210 and 212 connected by a small curve 211, which is too weak to expose the photoresist.

As previously described, the above resolution enhancement techniques and structures can be used with different adjacent films. They can also be used with one film over the other, such as the light-transparent substrate 114 having a partially transparent film 220 with an opaque film 222 over it.

An optical-proximity-correction (OPC) binary mask portion 230 is generally for sharp, repeating parallel features. The partially transparent film 220 and the opaque film 222 have repeated parallel openings, of which one opening 231 and an OPC feature 232 are shown. The mask electric fields 132 are a rectangular block 233 and a thin rectangular block 234. The wafer electric fields 134 are a large peaked curve 235 and a small peaked curve 236. The mask intensities are form a single well-defined peaked curve 237.

An attenuated phase shift mask (Att-PSM) portion 240 has the opaque film 222 removed (as indicated by the dotted lines) from the partially transparent film 220. The Att-PSM portion 240 thus only has the partially transparent film 220 to transmit only 5% to 10% of the light and to produce a phase shift of 180°. The partially transparent film 220 has two openings 241 and 242. The mask electric fields 132 are two spaced apart rectangular blocks 243 and 245 connected by a phase shifted small rectangular block 244. The wafer electric fields 134 are two peaked curves 246 and 248 connected by a flattened region 247. The mask intensities are two well-defined peaked curves 249 and 251 connected by a small curve 250, which is too weak to expose the photoresist.

The optical-proximity-correction (OPC) binary mask portion 230 and the Att-PSM portion 240 are shown for exemplary purposes producing the respective tightly spaced polysilicon wordlines 260 and isolated polysilicon gates 262 on respective core region 264 and peripheral region 266 on the semiconductor substrate 112 using the single patterned mask 104 (FIG. 1). The tightly spaced wordlines structures would be proximally spaced and the isolated gate structures would be distally spaced.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set hithertofore forth herein or shown in the accompanying drawings are to be interpreted in an illustrative and non-limiting sense.

The invention claimed is:

1. A phase controlling semiconductor manufacturing resolution enhancement method comprising:
   providing a transparent substrate;
   forming a first resolution enhancement structure over a first portion of the transparent substrate; and
   forming a second resolution enhancement structure over a second portion of the transparent substrate, the second resolution enhancement structure different from the first resolution enhancement structure, forming the second resolution enhancement structure further comprises placing a single partially transparent film on the transparent substrate and an opaque film on the partially transparent film; and
   processing the opaque film to form a mask.

2. The method as claimed in claim 1 additionally comprising:
   providing a first film on the first portion of the transparent substrate having the first resolution enhancement structure formed therein; and
   providing a second film on the second portion of the transparent substrate having the second resolution enhancement structure formed therein.

3. The method as claimed in claim 1 additionally comprising;
   providing a first film on the transparent substrate;
   providing a second film on the first film;
   removing a portion of the second film to form the first resolution enhancement structure in the first film; and
   forming the second resolution enhancement structure in the first and second films.

4. The method as claimed in claim 1 wherein:
   forming the first resolution enhancement structure uses a structure selected from a group consisting of a binary mask portion, a phase shift mask portion, a proximity effect mask portion, an alternating phase shift mask portion, an attenuated phase shift mask portion, and a combination thereof.

5. The method as claimed in claim 1 wherein:
   forming the first resolution enhancement structure forms the structure over a core portion of the mask; and
   forming the second resolution enhancement structure forms the structure over a periphery portion of the mask.

6. The method as claimed in claim 1 wherein: placing the mask in a lithography system.

7. The method as claimed in claim 1 additionally comprising:
   forming a semiconductor substrate having tightly spaced structures on the first portion and isolated structures on the second portion of the semiconductor substrate.

8. A phase controlling semiconductor manufacturing enhancement method comprising:
   providing a light-transparent substrate;
   forming a first resolution enhancement structure over a first portion of the light-transparent substrate; and
   forming a second resolution enhancement structure over a second portion of the light-transparent substrate, the second resolution enhancement structure different from the first resolution enhancement structure, the second resolution enhancement structure using a single partially light-transparent film on the light-transparent substrate and an opaque film on the partially light-transparent film; and processing the opaque film to form a patterned mask.

9. The method as claimed in claim 8 additionally comprising:
providing an opaque film on the first portion of the light-transparent substrate having the first resolution enhancement structure formed therein; and
providing a partially transparent film on the second portion of the light-transparent substrate having the second resolution enhancement structure formed therein.

10. The method as claimed in claim 8 additionally comprising:
providing a partially transparent film on the transparent substrate;
providing an opaque film on the partially transparent film;
removing a portion of the opaque film to form the first resolution enhancement structure in the partially transparent film; and
forming the second resolution enhancement structure in the partially transparent and opaque films.

11. The method as claimed in claim 8 wherein:
forming the first resolution enhancement structure uses a structure selected from a group consisting of a binary mask portion, a phase shift mask portion, a proximity effect mask portion, an alternating phase shift mask portion, an attenuated phase shift mask portion, and a combination thereof; and
forming the second resolution enhancement structure uses a structure selected from a group consisting of a binary mask portion, a phase shift mask portion, a proximity effect mask portion, an alternating phase shift mask portion, an attenuated phase shift mask portion, and a combination thereof.

12. The method as claimed in claim 8 wherein:
forming the first resolution enhancement structure forms the structure over a core portion of the mask; and
forming the second resolution enhancement structure forms the structure over a periphery portion of the mask.

13. The method as claimed in claim 8 wherein:
placing the mask in a photolithography system.

14. The method as claimed in claim 8 additionally comprising:
forming a semiconductor substrate having proximally spaced structures on the first portion in a core portion of the semiconductor substrate and distally spaced structures on the second portion in a peripheral portion of the semiconductor substrate.

15. A phase controlling semiconductor manufacturing resolution enhancement system comprising:
a transparent substrate;
a first resolution enhancement structure over a first portion of the transparent substrate; and
a second resolution enhancement structure over a second portion of the transparent substrate, the second resolution enhancement structure different from the first resolution enhancement structure, the second resolution enhancement structure has a single partially transparent film on the transparent substrate and an opaque film on the partially transparent film; and
the transparent substrate, the first resolution enhancement structure, and the second resolution enhancement structure form a mask.

16. The system as claimed in claim 15 additionally comprising:
a first film on the first portion of the transparent substrate having the first resolution enhancement structure therein; and
a second film on the second portion of the transparent substrate having the second resolution enhancement structure therein.

17. The system as claimed in claim 15 additionally comprising:
a first film on the transparent substrate;
a second film on the first film having a portion of the second film removed to form the first resolution enhancement structure in the first film; and
the second resolution enhancement structure in the first and second film.

18. The system as claimed in claim 15 wherein:
the first resolution enhancement structure uses a structure selected from a group consisting of a binary mask portion, a phase shift mask portion, a proximity effect mask portion, an alternating phase shift mask portion, an attenuated
phase shift mask portion, and a combination thereof.

19. The system as claimed in claim 15 wherein:
the first resolution enhancement structure is over a core portion of the mask; and
the second resolution enhancement structure is over a periphery portion of the mask.

20. The system as claimed in claim 15 wherein:
the mask is in a lithography system.

21. The system as claimed in claim 15 additionally comprising:
a semiconductor substrate having tightly spaced structures on the first portion and isolated structures on the second portion of the semiconductor substrate.

22. A phase controlling semiconductor manufacturing enhancement system comprising:
a light-transparent substrate;
a first resolution enhancement structure over a first portion of the light-transparent substrate; and
a second resolution enhancement structure over a second portion of the light-transparent substrate, the second resolution enhancement structure different from the first resolution enhancement structure, the second resolution enhancement structure has a single partial light-transparent film on the light-transparent substrate and an opaque film on the partially light-transparent film; and
the light-transparent substrate, the first resolution enhancement structure, and the second resolution enhancement structure from a patterned mask.

23. The system as claimed in claim 22 additionally comprising:
an opaque film on the first portion of the light-transparent substrate having the first resolution enhancement structure therein; and
a partially transparent film on the second portion of the light-transparent substrate having the second resolution enhancement structure therein.

24. The system as claimed in claim 22 additionally comprising:
a partially transparent film on the transparent substrate;
an opaque film on the partially transparent film having a portion of the opaque film removed to form the first resolution enhancement structure in the partially transparent film; and the second resolution enhancement structure in the partially transparent and opaque films.

25. The system as claimed in claim 22 wherein:
the first resolution enhancement structure uses a structure selected from a group consisting of a binary mask portion, a phase shift mask portion, a proximity effect mask portion, an alternating phase shift mask portion, an attenuated phase shift mask portion, and a combination thereof; and
the second resolution enhancement structure uses a structure selected from a group consisting of a binary mask portion, a phase shift mask portion, a proximity effect mask portion, an alternating phase shift mask portion, an attenuated phase shift mask portion, and a combination thereof.

26. The system as claimed in claim 22 wherein:
the first resolution enhancement structure is over a core portion of the mask; and
the second resolution enhancement structure is over a periphery portion of the patterned mask.

27. The system as claimed in claim 22 wherein:
the patterned mask is in a photolithography system.

28. The system as claimed in claim 22 additionally comprising:
a semiconductor substrate having proximally spaced structures on the first portion in a core portion of the semiconductor substrate and distally spaced structures on the second portion in a peripheral portion of the semiconductor substrate.

* * * * *

UNITED STATES PATENT AND TRADEMARK OFFICE
CERTIFICATE OF CORRECTION

PATENT NO. : 6,994,939 B1  
APPLICATION NO. : 10/283685  
DATED : February 7, 2006  
INVENTOR(S) : Ghandehari et al.

Page 1 of 1

It is certified that error appears in the above-identified patent and that said Letters Patent is hereby corrected as shown below:

Column 3:
    Line 24, delete "Š/NA" and insert therefor --$\lambda$/NA--  
    Line 26, delete "Š" and insert therefor --$\lambda$--

Column 4:
    Line 21, delete "Š/2" and insert therefor --$\lambda$/2--  
    Line 63, delete "Š/2" and insert therefor --$\lambda$/2--

Column 6:
    Claim 3, line 31, delete "comprising;" and insert therefor --comprising:--

Column 8:
    Claim 22, line 45, delete "partial" and insert therefor --partially--  
    Claim 22, line 51, delete "from" and insert therefor --form--

Signed and Sealed this

Twenty-ninth Day of August, 2006

JON W. DUDAS  
*Director of the United States Patent and Trademark Office*